United States Patent
Pennypacker et al.

(10) Patent No.: US 7,252,523 B1
(45) Date of Patent: Aug. 7, 2007

(54) SOCKET CONNECTOR HAVING LATCH BIASING MEMBER

(75) Inventors: Jeffrey George Pennypacker, Harrisburg, PA (US); Daniel Robert Ringler, Elizabethville, PA (US); Richard Nicholas Whyne, Camp Hill, PA (US)

(73) Assignee: Tyco Electronics Corporation, Middletown, PA (US)

( * ) Notice: Subject to any disclaimer, the term of this patent is extended or adjusted under 35 U.S.C. 154(b) by 0 days.

(21) Appl. No.: 11/506,440

(22) Filed: Aug. 18, 2006

(51) Int. Cl.
*H01R 13/62* (2006.01)
(52) U.S. Cl. ...................... 439/160; 439/157
(58) Field of Classification Search .............. 439/160, 439/152, 155, 157, 372
See application file for complete search history.

(56) References Cited

U.S. PATENT DOCUMENTS

| | | | | |
|---|---|---|---|---|
| 5,577,922 A | * | 11/1996 | Enomoto et al. | 439/157 |
| 5,690,499 A | | 11/1997 | Howell et al. | |
| 5,957,708 A | * | 9/1999 | Lin | 439/157 |
| 6,185,106 B1 | * | 2/2001 | Mueller | 361/798 |
| 6,267,614 B1 | * | 7/2001 | Good et al. | 439/327 |
| 6,431,890 B1 | * | 8/2002 | Li et al. | 439/160 |
| 6,616,466 B2 | * | 9/2003 | Frantum et al. | 439/157 |

* cited by examiner

*Primary Examiner*—Hien Vu

(57) ABSTRACT

A socket connector includes a housing extending along a longitudinal axis between opposed ends. The housing includes a mounting face configured to be received on the circuit board and a slot configured to receive the mating edge of the card edge module. A latch member is pivotably connected to the housing. The latch member is movable between an open position and a closed position. A biasing member is connected between the housing and the latch member. The biasing member biases the latch member toward the closed position.

18 Claims, 6 Drawing Sheets

SOCKET CONNECTOR HAVING LATCH BIASING MEMBER

BACKGROUND OF THE INVENTION

The invention relates generally to socket connectors for retaining card edge modules and, more particularly, to a socket connector that limits movement of the card edge module within the socket.

Computers and servers may use numerous types of electronic modules, such as processor and memory modules (e.g. Dynamic Random Access Memory (DRAM), Synchronous Dynamic Random Access Memory (SDRAM), or Extended Data Out Random Access Memory (EDO RAM), and the like). The memory modules are produced in a number of formats such as, for example, Single In-line Memory Modules (SIMM's), or the newer Dual In-line Memory Modules (DIMM's) and Fully Buffered DIMM's.

Typically, the modules are installed in one or more multi-pin sockets mounted on a system board or motherboard. Each memory module has a card edge that provides an interface generally between two rows of contacts in the socket. Conventionally, the card edge interface is a separable card edge interface. These card edge interfaces, however, are generally not high reliability interfaces. The modules are generally held in the socket by latches on the socket and by contact normal forces. These card edge interfaces may fail when subjected to shock and vibration. Under extreme vibration, the latches may be jarred open allowing the module to become dislodged. During vibration, the module may also experience sufficient motion within the socket to cause fretting of the gold on gold contact interfaces which increases resistance and may cause failures.

One approach for increasing reliability of the card edge interface is to directly attach the module via an inseparable interface. This is sometimes done when it is desirable that the end user not be able to remove processors or memory modules from the system so that problems that might arise from reconfiguration of the system do not occur. The provision of a high reliability interface that limits motion of the module within the socket remains difficult.

BRIEF DESCRIPTION OF THE INVENTION

In one aspect, a socket connector for connecting a card edge module to a circuit board is provided. The socket connector includes a housing extending along a longitudinal axis between opposed ends. The housing includes a mounting face configured to be received on the circuit board and a slot configured to receive the mating edge of the card edge module. A latch member is pivotably connected to the housing. The latch member is movable between an open position and a closed position. A biasing member is connected between the housing and the latch member. The biasing member biases the latch member toward the closed position.

Optionally, the latch member is connected to a first pivot point on the housing and the biasing member is connected to a second pivot point on the housing that is lower than the first pivot point. The biasing member is attached to the latch member at a point that is higher than the first pivot point. The biasing member includes a portion that is received in a notch in the card edge module when the latch member is in the closed position. The biasing member includes a pair of upper beams and a pair of lower beams and the latch member is disposed substantially between the pairs of upper and lower beams. Each of the opposed ends of the housing includes a portion having spaced-apart side walls and the biasing member includes a pair of lower beams that are disposed between the side walls.

In another embodiment, a socket connector for connecting a card edge module to a circuit board includes a housing extending along a longitudinal axis between opposed ends. The housing includes a mounting face configured to be received on the circuit board and a slot configured to receive the mating edge of the card edge module. A latch member is pivotably connected to the housing. The latch member is movable between an open position and a closed position. A biasing member is connected between the housing and the latch member. The biasing member is configured to apply a vertical force on the card edge module to inhibit movement of the card edge module in the slot.

DETAILED DESCRIPTION OF THE INVENTION

Figure 1:
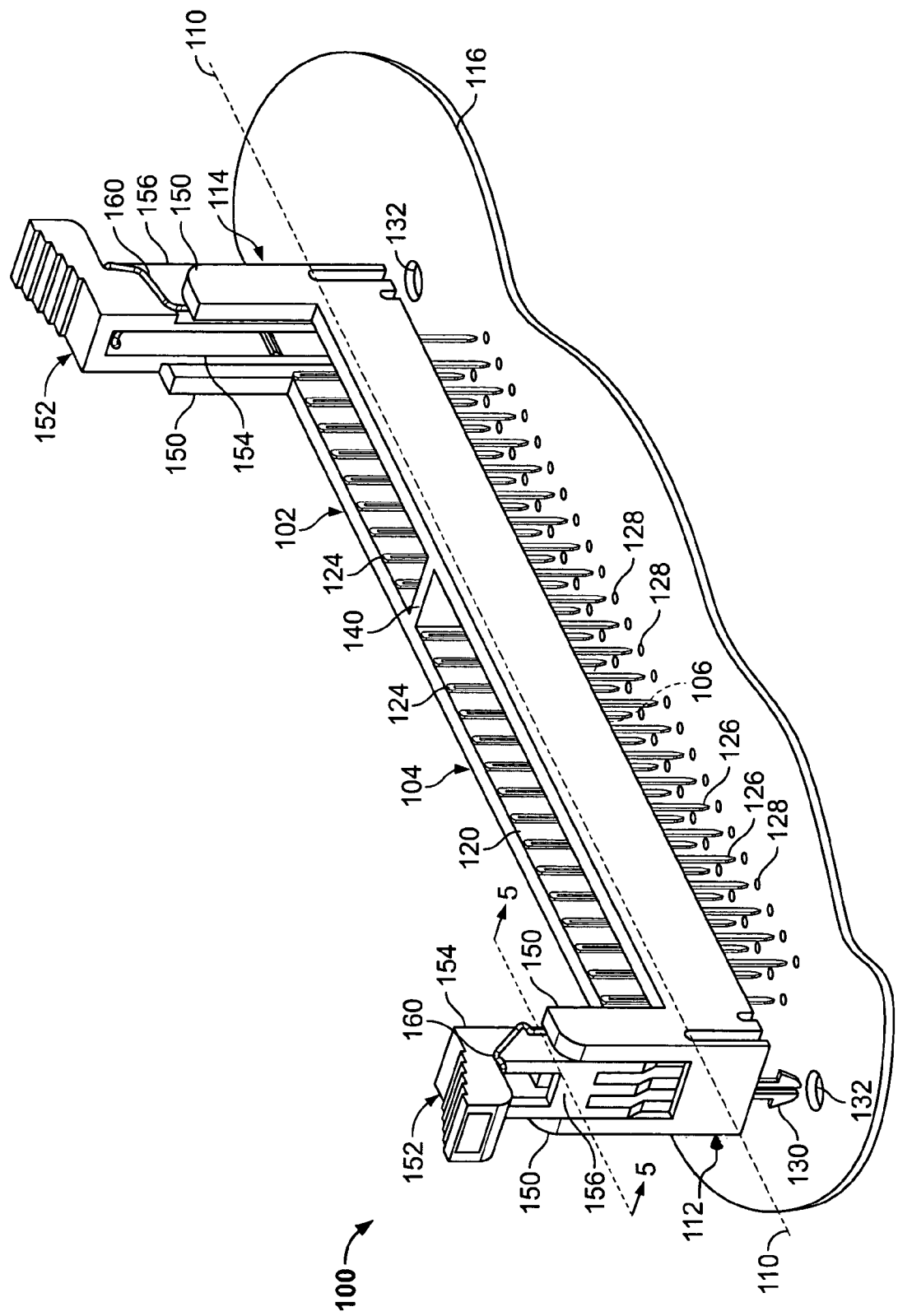
FIG. 1 is a perspective view of a socket connector formed in accordance with an exemplary embodiment of the present invention.

FIG. 1 illustrates a socket connector 100 formed in accordance with an exemplary embodiment of the present invention. The connector 100 includes a dielectric housing 102 having an upward facing mating face 104 and a mounting face 106. The housing 102 extends along a longitudinal axis 110 between opposed ends 112 and 114. The connector 100 is configured to be mounted to a circuit board 116. The housing 102 includes a longitudinally extending slot 120 that is configured to receive the mating edge of a card edge electronic module or module card 300 (see FIG. 8). The housing 102 holds a plurality of electrical contacts 124 arranged in rows on each side of the slot 120. The contacts 124 include contact tails 126 that are configured to be received in apertures 128 when the connector 100 is mounted to the circuit board 116. The housing 102 may also include board locks 130 at each end 112, 114 that are received in mounting apertures 132 to secure the connector 100 to the circuit board 116. In alternative embodiments, the connector 100 may be surface mounted to the circuit board 116 and may or may not include board locks 130. A key 140 may be provided at an off-center position in the slot 120 to assure that the module card 300 is properly aligned with respect to the connector 100. The module card 300 includes a corresponding notch (not shown) that receives the key 140 when inserted into the connector 100.

Each end 112 and 114 includes upwardly extending and spaced-apart side panels 150. Latch members 152 are positioned between the side panels 150 and are pivotably connected to the housing 102 at the ends 112 and 114. The latch members 152 may also be referred to as extractors. The latch members 152 are movable between an open position to receive the module card 300 (FIG. 9) in the connector 100 and a closed position to retain the module card 300 in the connector 100. The latch member 152 has an inner side or card engagement side 154 and an outer side 156. A biasing member 160 is connected between the housing 102 and the latch member 152 to bias the latch member 152 toward the closed position. In an exemplary embodiment, the biasing member 160 is a wire spring.

Figure 2:
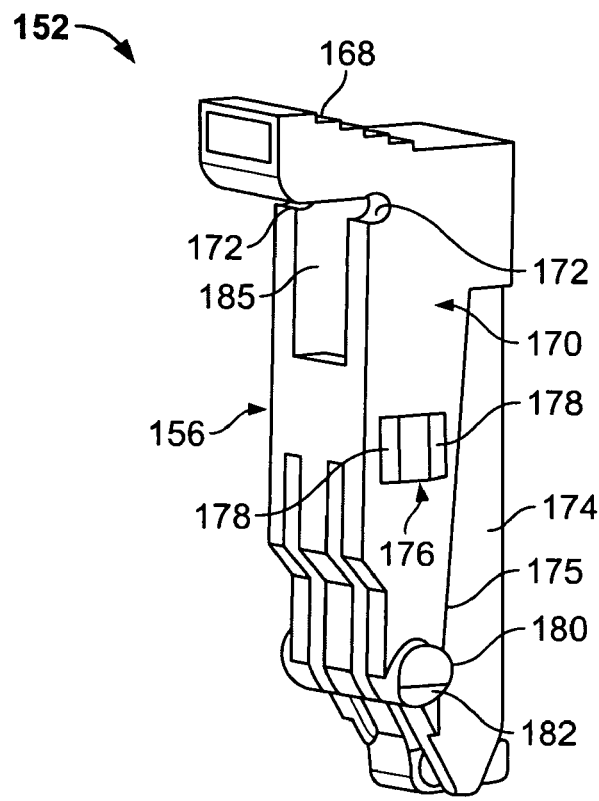
FIG. 2 is a perspective view of a latch member taken from the outer side.
Figure 3:
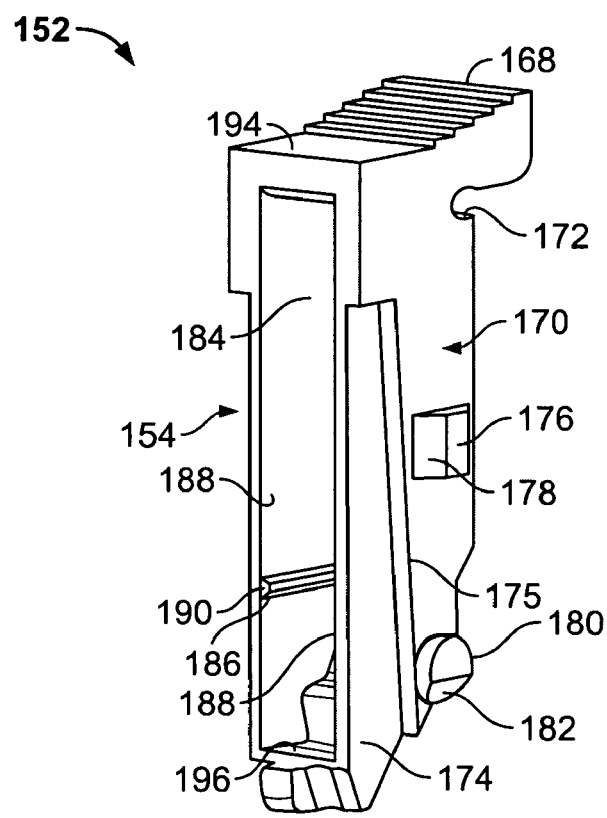
FIG. 3 is a perspective view of the latch member shown in FIG. 2 taken from the inner side.

FIG. 2 illustrates a perspective view of latch member 152 taken from the outer side 156. FIG. 3 illustrates a perspective view of latch member 152 taken from the inner side 154. The latch member 152 includes a thumb pad 168 and sides 170. Retention notches 172 are formed in the sides 170 below the thumb pad 168. A recess 174 is formed in each side 170 to provide clearance for the biasing member 160. A raised edge 175 defines a boundary of the recess 174. A projection 176 is formed on each side 170. The projections 176 include beveled surfaces 178. The projections 176 engage inner surfaces of the housing side panels 150 when the latch members 152 are closed to further retain the latch members 152 in the closed position. Pivot posts 180 extend from each side 170 to mount or connect the latch members 152 to the housing 102 (FIG. 1). The pivot posts 180 are substantially circular in cross section to facilitate a rotatable connection of the latch members 152 to the housing 102. The pivot posts 180 are provided with beveled surfaces 182 to facilitate assembly of the latch members 152 into the housing ends 112 and 114.

Figure 8:
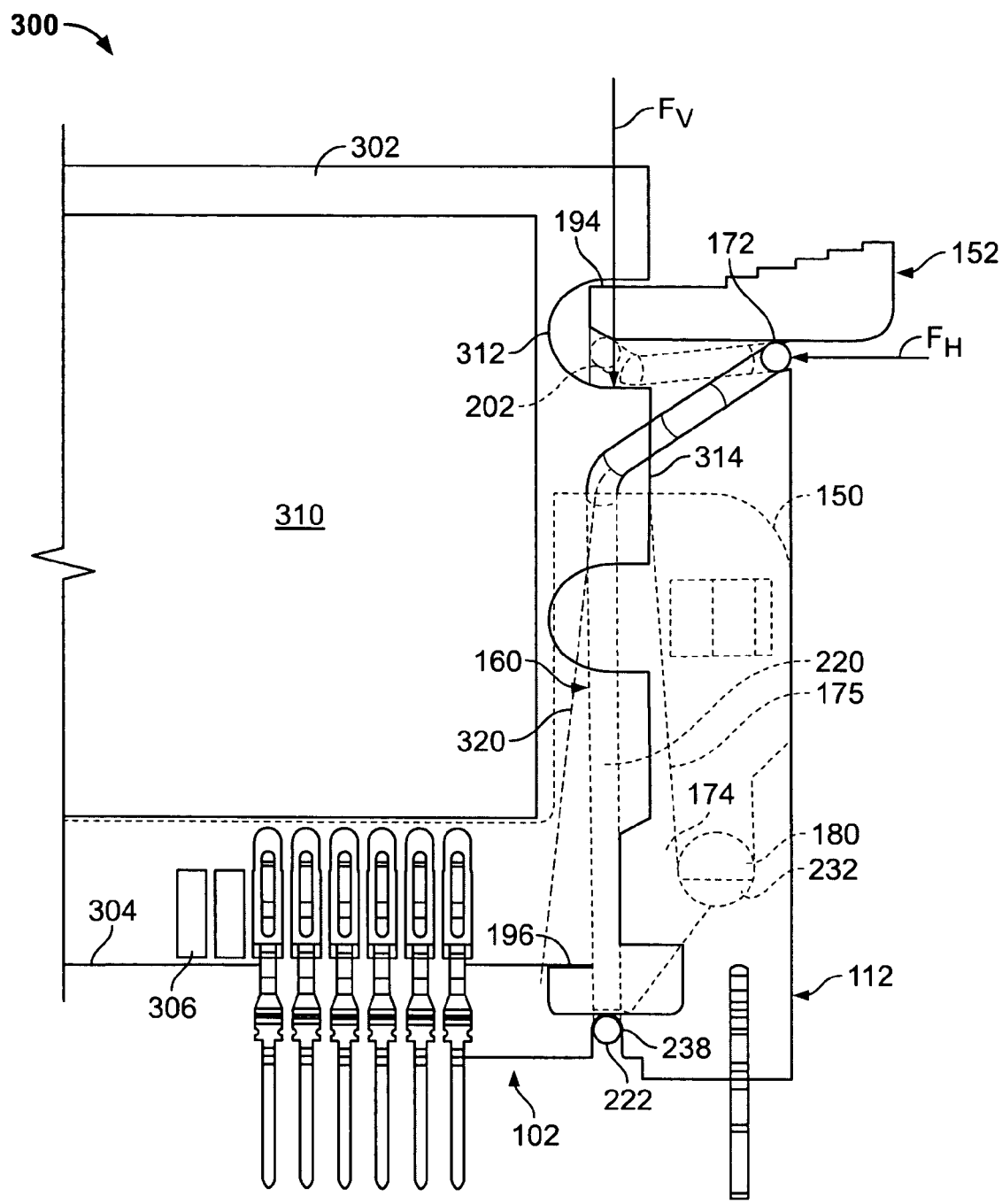
FIG. 8 is a fragmentary side view illustrating the latch member and the biasing member assembled in the connector housing with the latch member in the closed position.

The inner side 154 of the latch members 152 includes a slot 184 that receives an edge of the module card 300 (FIG. 8). An opening 185 extends through the latch members 152 from the outer side 156 to the slot 184. Ribs 186 are formed on interior sides 188 of the slot 184 to assist in stabilizing and retaining the module card 300. A beveled forward edge 190 on the ribs 186 provides guidance facilitating entry of the module card edge into the slot 184. The latch member 152 includes a latch element 194 that is received in a notch on the module card 300 when the latch member is closed, as will be described. The latch member 152 also includes a foot 196 that engages a lower edge of the module card 300. When the latch member 152 is opened, the foot 196 lifts the module card 300 upward to assist in the extraction of the module card 300 from the housing 102.

Figure 4:
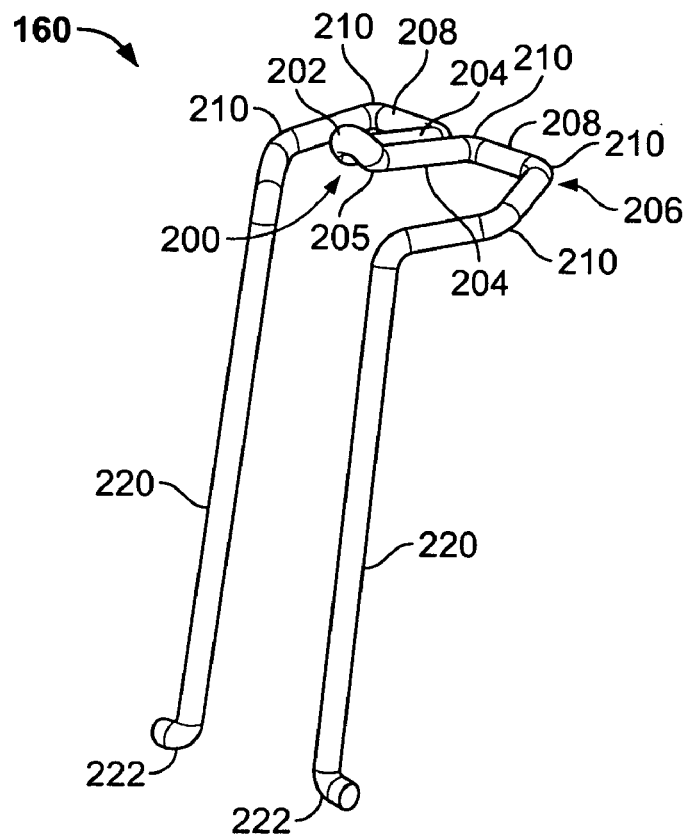
FIG. 4 is a perspective view of the biasing member shown in FIG. 1.

FIG. 4 illustrates a perspective view of the biasing member 160. In an exemplary embodiment, the biasing member 160 is formed from a continuous length of spring wire. The biasing member 160 includes a center section 200 that has an inwardly projecting bend 202 from which outwardly projecting portions 204 extend. The bend 202 is angled slightly upward from the portions 204 at a bend 205 to provide a lead in for the insertion of the inwardly projecting bend 202 into a notch in the electronic module 300 (see FIG. 8). A pair of angularly bent upper beam portions 206 that include upper mounting sections 208 and a plurality of bends 210 such that the upper beam portions 206 wrap around to extend in the same general direction as the bend 202. A lower beam section 220 extends linearly downwardly from each upper beam portion 206 and culminates with a sidewardly extending lower mounting end 222 that is provided to connect the biasing member 160 to the housing 102 (FIG. 1).

Figure 5:
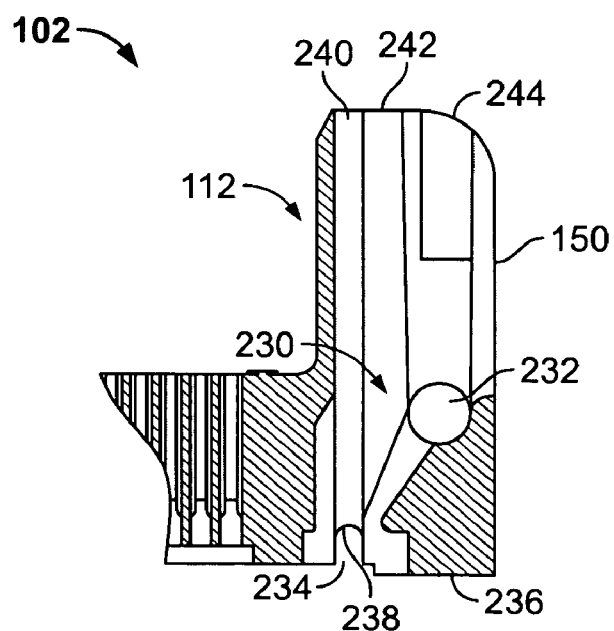
FIG. 5 is a cross-sectional view of an end of the housing taken along the line 5-5 shown in FIG. 1.

FIG. 5 is a cross-sectional view of the housing end 112. Housing end 112 includes a cavity 230 that receives the latch member 152 and the biasing member 160. Apertures 232 are provided to receive the pivot posts 180 (FIG. 2) on the latch member 152 to rotatably connect the latch member 152 to the housing end 112. Walls of the apertures provide first pivot supports that support the latch members 152. A slot 234 at a lower end 236 of the housing end 112 is provided to connect or anchor the biasing member 160 (FIG. 4) to the housing 102. An end surface 238 in the slot 234 provides a second pivot support that supports the biasing member 160. The second pivot support 238 of the biasing member 160 is relatively below the first pivot support 232 of the latch member 152. Channels 240, 242, and 244 are provided to aid in the assembly of the latch member 152 in the housing end 112. The channels 240, 242, 244 are recessed to provide a clearance for lower beam sections 220 of the biasing member 160.

Figure 6:
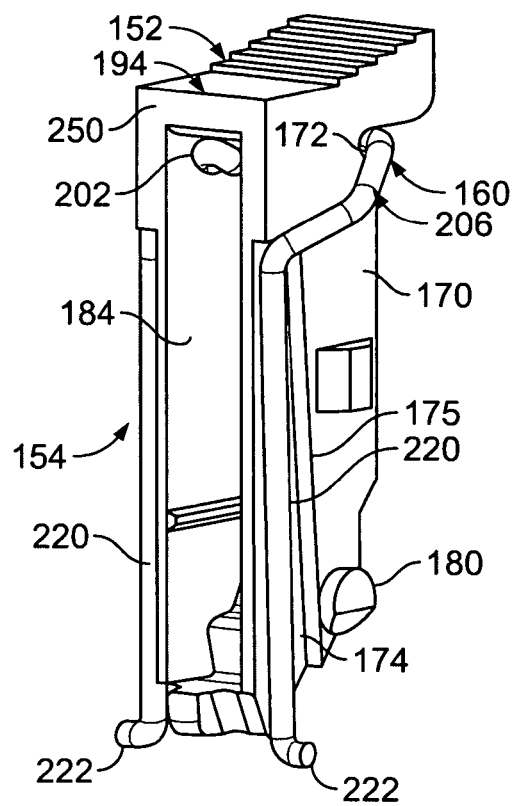
FIG. 6 is a perspective view of an assembled latch member and biasing member taken from the inner side of the latch member.
Figure 7:
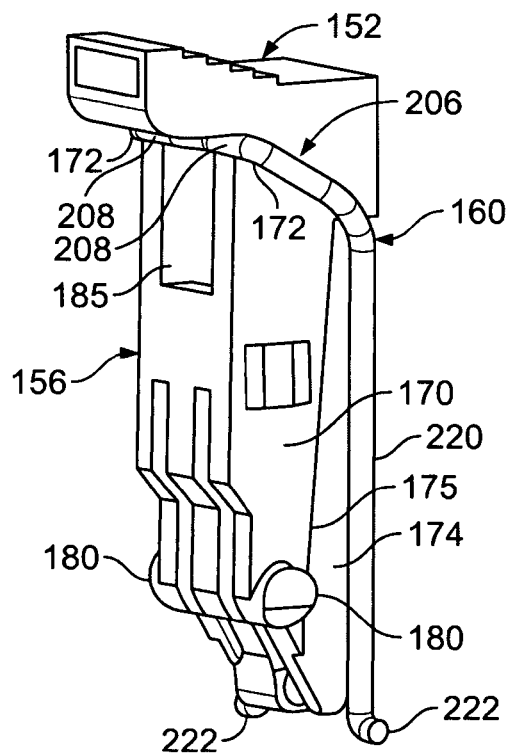
FIG. 7 is a perspective view of the assembled latch member and biasing member shown in FIG. 6 taken from the outer side of the latch member.

FIG. 6 is a perspective view of the biasing member 160 assembled to the latch member 152 as seen from the inner side 154 of the latch member 152. FIG. 7 is a perspective view of the biasing member 160 assembled to the latch member 152 as seen from the outer side 156 of the latch member 152. In assembling the biasing member 160 to the latch member 152, the center section 200 (FIG. 4) of the biasing member 160 is inserted into the opening 185 from the outer side 156 of the latch member 152. The upper mounting sections 208 of the biasing member 160 are pressed into the retaining notches 172 where they are retained with a snap fit. The bend 202 extends approximately to an inward face 250 of the latch element 194. The upper beam portions 206 of the biasing member 160 wrap around the latch member sides 170 so that the lower beams 220 are positioned in the recesses 174 of the sides 170. The latch member is thus disposed between the pairs of upper beam portions 206 and the lower beams 220. Once assembled, the latch member 152 and biasing member 160 are inserted into the cavity 230 until the latch member pivot posts 180 are received in the housing apertures 232 and the lower mounting ends 222 of the biasing member 160 snap into the housing slot 234. During the assembly process the lower beams 220 are deflected from a free length position toward the outward side 156 of the latch member 152 to preload the biasing member 160. The biasing member 160 then biases the latch member 152 toward the closed position.

Figure 9:
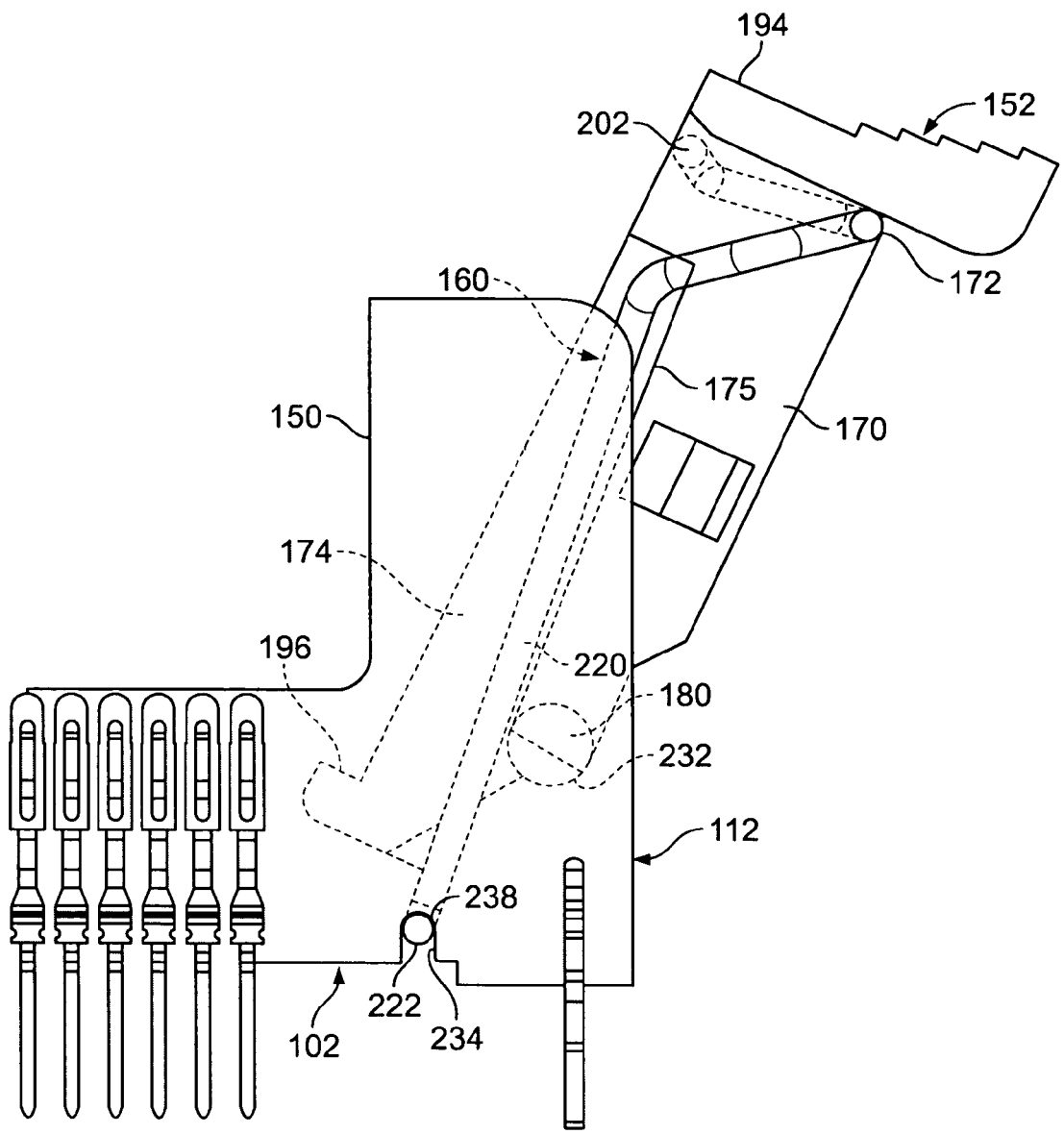
FIG. 9 is a fragmentary side view illustrating the latch member and the biasing member assembled in the connector housing with the latch member in the open position.

FIG. 8 is a fragmentary side view illustrating the latch member 152 and the biasing member 160 assembled in the connector housing 102 with the latch member 152 in the closed position. FIG. 9 is a fragmentary side view illustrating the latch member 152 and the biasing member 160 assembled in the connector housing 102 with the latch member 152 in the open position. In FIGS. 8 and 9, the housing end 112 is partially cut away to reveal the latch member 152 and biasing member 160. In FIG. 8, an electronic module or module card 300 is installed in the housing 102. The module card 300 includes a substantially planar substrate 302 that has a mating edge 304 and a plurality of electrical traces, each of which terminates at a respective plated contact pad 306 along the mating edge 304. The substrate 302 may also include surface mounted components generally represented at 310. The substrate 302 also includes a notch 312 that is provided generally to receive a latch element. More specifically, with the connector 100, the notch 312 receives both the latch element 194 and the bend 202 of the biasing member 160. A non-contact edge 314 of the module card 300 is received in the slot 184 (FIG. 6) of the latch member 152. The latch member foot 196 engages the mating edge 304. When the latch member is opened, the latch member foot 196 moves upwardly to extract the module card 300 from the housing 102.

The biasing member 160 has a free-state geometry wherein the lower beam 220 occupies the position indicated by the phantom line 320. The lower beam 220 is deflected from the free-state position 320 to the position shown in FIG. 8 during assembly of the latch member 152 and the biasing member 160 in the housing 102. This deflection of the lower beam 220 to the assembled position wherein the mounting end 222 is positioned in the slot 234 to engage the slot surface 238 generates a preload in the biasing member 160. The action of moving the mounting end 222 to the slot 234 applies a biasing force on the latch member 152 at the notches 172 on the latch member 152 that receive the upper mounting portions 208 (FIG. 4) of the biasing member 160 and generates the preload in the biasing member 160. The preload in the biasing member 160 translates into a lateral force $F_H$ on the latch member 160 that urges the latch member 160 toward the closed position. The preload also generates a vertical downward force $F_V$ directly on the module card 300 from the bend 202 that inhibits movement of the module card 300 within the housing slot 120 (FIG. 1).

In FIG. 9, the latch member 152 is shown rotated outward to the open position shown. In the open position, the latch member foot 196 is elevated and the module card 300 is removed. The lower beam 220 is proximate the raised edge 175 of the recess 174. The mounting end 222 of the biasing member 160 is restrained by the slot 234 so that when opened, the spring load in the biasing member 160 is increased. The spring load urges the latch member 152 toward the closed position. The latch members 152 must be held open to insert the module card 300 (FIG. 8). In some embodiments, the lower beam 220 may exhibit a slight bend depending on the stiffness of the material from which the biasing member is fabricated. In an exemplary embodiment, the biasing member 160 is fabricated from stainless steel.

The embodiments thus described provide a socket connector 100 having latch members 152 that positively retain an electronic module or module card 300 in the socket 100. The latch members 152 include a spring 154 that provides a load on the latch members 152 that assures that the latch members 152 remain closed if subjected to vibration during operation. The spring 154 also provides a vertical force on the module card 300 to inhibit up and down movement of the module card 300 within the slot 120 in the socket 100. This preserves the gold on gold interface between the socket contacts 124 and the module card contact pads 306 eliminating fretting of the contacts 124 and pads 306 which renders the connector 100 less prone to failure.

While the invention has been described in terms of various specific embodiments, those skilled in the art will recognize that the invention can be practiced with modification within the spirit and scope of the claims.

What is claimed is:

1. A socket connector for connecting a card edge module to a circuit board, said socket connector comprising:
   a housing extending along a longitudinal axis between opposed ends, the housing including contacts, a mounting face configured to be received on the circuit board and a slot configured to receive a mating edge of the card edge module;
   a latch member pivotably connected to said housing, said latch member being movable between an open position and a closed position; and
   a biasing member connected between said housing and said latch member, said biasing member biasing said latch member toward said closed position;
   wherein said biasing member includes a pair of upper beams and a pair of lower beams and said latch member is disposed substantially between said pairs of upper and lower beams.

2. The socket connector of claim 1, wherein said latch member is pivotal on a first pivot support of said housing and said biasing member is pivotal on a second pivot support of said housing.

3. The socket connector of claim 2, wherein said second pivot support is relatively lower than said first pivot support.

4. The socket connector of claim 1, wherein said biasing member includes a portion that is received in a notch in the card edge module when said latch member is in said closed position.

5. The socket connector of claim 1, wherein each of said opposed ends of said housing includes a portion having spaced-apart side panels and said lower beams are disposed between said side panels.

6. The socket connector of claim 1, wherein said latch member includes notches that receive said biasing member with a snap fit.

7. The socket connector of claim 1, wherein said biasing member comprises a spring formed from a continuous length of spring wire.

8. The socket connector of claim 1, wherein said biasing member comprises a continuously formed spring having a centrally located bend.

9. The socket connector of claim 1, wherein said pair of lower beams are disposed in recesses in said latch member.

10. A socket connector for connecting a card edge module to a circuit board, said socket connector comprising:
    a housing extending along a longitudinal axis between opposed ends, the housing including contacts, a mounting face configured to be received on the circuit board and a slot configured to receive a mating edge of the card edge module;
    a latch member pivotably connected to said housing, said latch member being movable between an open position and a closed position; and
    a biasing member connected between said housing and said latch member, said biasing member being configured to apply a vertical force on the card edge module to inhibit movement of the card edge module in the slot;
    wherein said biasing member includes a pair of upper beams and a pair of lower beams and said latch member is disposed substantially between said pairs of upper and lower beams.

11. The socket connector of claim 10, wherein said latch member is connected to a first pivot point on said housing and said biasing member is connected to a second pivot point on said housing that is lower than said first pivot point.

12. The socket connector of claim 10, wherein said latch member is connected to a first pivot point on said housing and said biasing member is attached to said latch member at a point that is higher than said first pivot point.

13. The socket connector of claim 10, wherein said biasing member and said latch member include a portions that are received in a notch in the card edge module when said latch member is in said closed position.

14. The socket connector of claim 10, wherein each of said opposed ends of said housing includes a portion having spaced-apart side panels and said lower beams are disposed between said side panels.

15. The socket connector of claim 1, wherein said latch member includes notches that receive said biasing member with a snap fit.

16. The socket connector of claim 10, wherein said biasing member comprises a spring formed from a continuous length of spring wire.

17. The socket connector of claim 10, wherein said biasing member comprises a continuously formed spring having a centrally located bend.

18. The socket connector of claim 10, wherein said pair of lower beams are disposed in recesses in said latch member.

* * * * *